United States Patent
Boivin

(10) Patent No.: US 12,213,392 B2
(45) Date of Patent: Jan. 28, 2025

(54) INSULATION OF PHASE-CHANGE MEMORY CELLS

(71) Applicant: STMicroelectronics (Rousset) SAS, Rousset (FR)

(72) Inventor: Philippe Boivin, Venelles (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 619 days.

(21) Appl. No.: 17/362,670

(22) Filed: Jun. 29, 2021

(65) Prior Publication Data
US 2021/0408374 A1 Dec. 30, 2021

(30) Foreign Application Priority Data
Jun. 30, 2020 (FR) .................................. 2006890

(51) Int. Cl.
 *H10N 70/00* (2023.01)
 *H10B 63/00* (2023.01)
 *H10N 70/20* (2023.01)

(52) U.S. Cl.
 CPC ......... *H10N 70/8616* (2023.02); *H10B 63/80* (2023.02); *H10N 70/021* (2023.02); *H10N 70/063* (2023.02); *H10N 70/231* (2023.02); *H10N 70/841* (2023.02); *H10N 70/8828* (2023.02)

(58) Field of Classification Search
 CPC .................................................. H10N 70/8616
 See application file for complete search history.

(56) References Cited

U.S. PATENT DOCUMENTS

| | | | |
|---|---|---|---|
| 7,670,869 B2* | 3/2010 | Yu | H10N 70/068 257/4 |
| 9,735,352 B2* | 8/2017 | Chen | H10B 63/20 |
| 10,147,875 B1* | 12/2018 | Hansen | H01L 21/76834 |
| 2003/0205809 A1* | 11/2003 | Xu | H10N 70/841 257/E21.507 |
| 2009/0101883 A1 | 4/2009 | Lai et al. | |
| 2015/0214478 A1 | 7/2015 | Lee et al. | |
| 2015/0280117 A1 | 10/2015 | Boniardi et al. | |
| 2017/0250339 A1 | 8/2017 | Sim et al. | |
| 2019/0165258 A1* | 5/2019 | Peng | H10N 50/10 |
| 2020/0411757 A1* | 12/2020 | Kim | H10N 70/882 |
| 2021/0328141 A1* | 10/2021 | Lin | H10N 70/063 |

* cited by examiner

Primary Examiner — Mounir S Amer
(74) Attorney, Agent, or Firm — Seed IP Law Group LLP

(57) ABSTRACT

Memory devices and methods of manufacturing such devices are provided herein. In at least one embodiment, a memory device includes a plurality of phase-change memory cells. An electrically-insulating layer covers lateral walls of each of the phase-change memory cells, and a thermally-insulating material is disposed on the electrically-insulating layer and covers the lateral walls of the phase-change memory cells.

17 Claims, 3 Drawing Sheets

INSULATION OF PHASE-CHANGE MEMORY CELLS

CROSS-REFERENCE TO RELATED APPLICATION

This application claims the priority benefit of French patent application number FR2006890, filed on Jun. 30, 2020, which is hereby incorporated by reference to the maximum extent allowable by law.

BACKGROUND

Technical Field

The present disclosure generally concerns memory devices, and more particularly resistive memory devices, for example, phase-change memory devices.

Description of the Related Art

Memories are generally in the form of arrays, comprising word lines and bit lines, that is, rows and columns. A memory cell, containing binary information, is located at each crossing of a row and of a column.

In a phase-change memory cell, for example, each memory cell comprises a layer of phase-change material, which is in contact with a resistive element. Phase-change materials are materials which may switch between a crystal phase and an amorphous phase. Such a switching is caused by an increase in the temperature of the resistive element through which an electric current is conducted. The difference in electric resistance between the amorphous phase of the material and its crystal phase is used to define at least two memory states, arbitrarily zero and one.

The data contained in a cell of a phase-change memory are for example, accessed, or read out, by measurement of the resistance between the bit line and the word line of the memory cell.

The memory cells are generally associated with a selection element, for example, a selection transistor. On writing into or reading from a cell, the selection element enables current to flow through the resistive element of the cell. The selection element thus enables to limit the current flowing through the other memory cells (not selected) and which might disturb the reading from or the writing into the cell.

BRIEF SUMMARY

An embodiment overcomes all or part of the disadvantages of devices comprising known phase-change memory cells.

An embodiment provides a memory device comprising phase-change memory cells, the lateral walls of each cell being covered with a first electrically-insulating layer and with at least one first thermally-insulating material.

An embodiment provides a method of manufacturing a memory device, comprising the forming of memory cells and the forming of a first electrically-insulating layer and of at least one first thermally-insulating material covering each lateral wall of the memory cells.

According to an embodiment, each memory cell comprises a stack of a resistive material, of a second layer of a phase-change material, and of an electrode resting on the first layer.

According to an embodiment, the electrically-insulating layer totally covers the lateral walls of the resistive element and of the first layer.

According to an embodiment, first cavities between memory cells are filled with the first thermally-insulating material and with air.

According to an embodiment, second cavities between memory cells are filled with the first thermally-insulating material.

According to an embodiment, third cavities comprise spacers made of the first thermally-insulating material on at least one wall, said at least one wall being formed by a lateral wall of a memory cell covered with the electrically-insulating layer.

According to an embodiment, the first thermally-insulating material is in contact with the first layer.

According to an embodiment, the first thermally-insulating material is a phase-change material.

According to an embodiment, the first thermally-insulating material is the material of the first layer.

According to an embodiment, the first electrically-insulating layer is made of silicon oxide or of silicon nitride.

According to an embodiment, the first material comprises portions made of an alloy of germanium, of antimony, and of tellurium, or of a chalcogen material made of germanium and of tellurium or of antimony and of tellurium, and air bubbles.

According to an embodiment, the electrically-insulating layer and the thermally-insulating material cover all the lateral walls of each cell.

According to an embodiment, the method comprises the conformal deposition of the first layer on the memory cells.

According to an embodiment, the method comprises the deposition of a third layer made of the first material, totally covering the memory cells and the first layer.

According to an embodiment, the method comprises a step of partial anisotropic etching of the third layer.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1A:
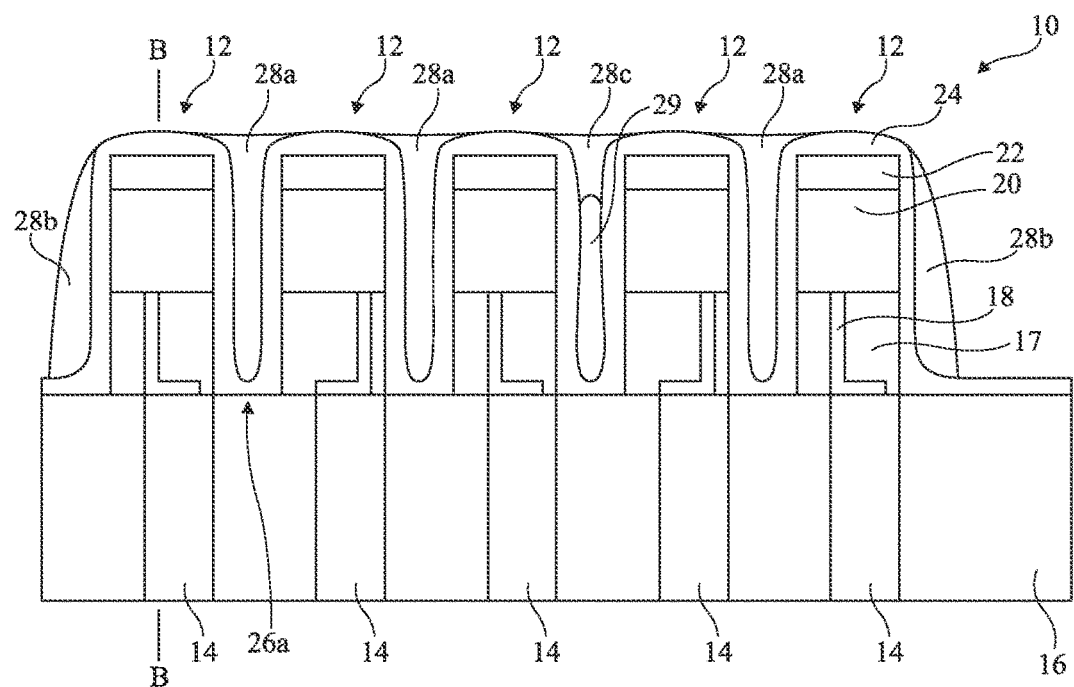
FIG. 1A shows a cross-section view of an electronic device comprising phase-change memory cells.
Figure 1B:
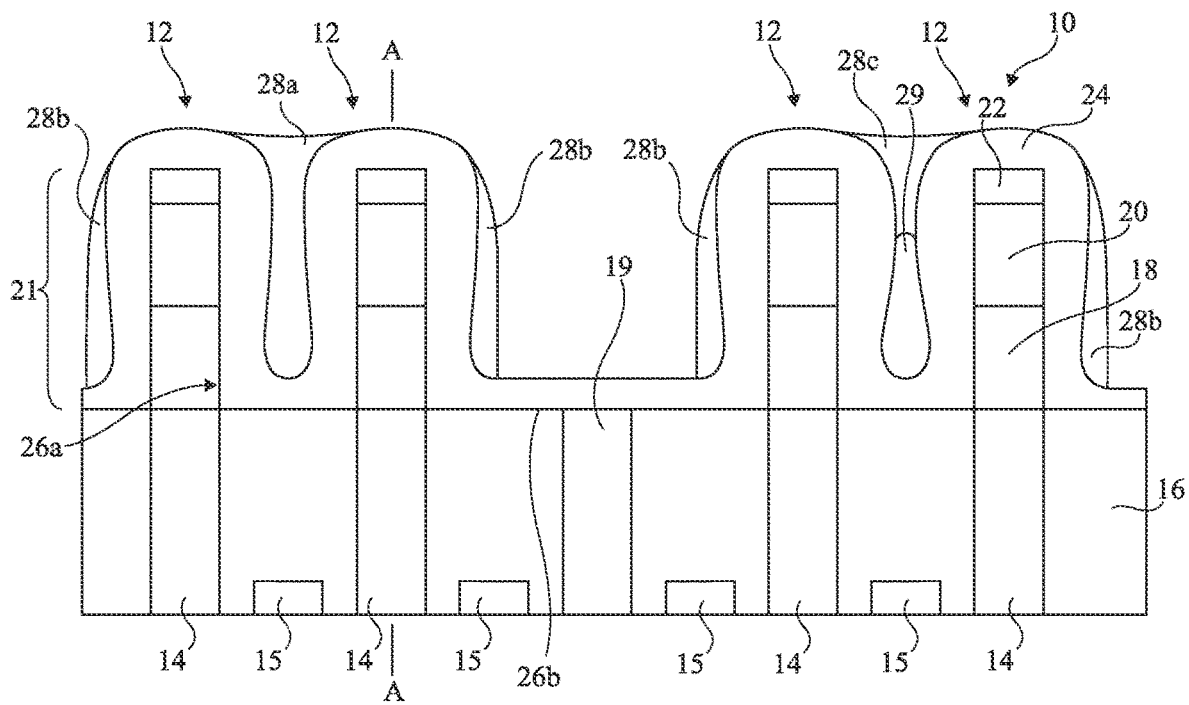
FIG. 1B shows another cross-section view of the electronic device of FIG. 1A.

FIG. 1A shows a cross-section view of an electronic device 10 comprising phase-change memory cells. FIG. 1B shows another cross-section view of the electronic device of FIG. 1A. More particularly, FIG. 1A shows a cross-section view along a plane AA of FIG. 1B and FIG. 1B shows a cross-section view along a plane BB of FIG. 1A.

Device 10 comprises at least one memory, and more particularly comprises a plurality of memory cells 12. Each memory cell 12 for examples contains binary data. Memory cells 12 are preferably arranged in the form of an array. FIG. 1A shows five memory cells of a same word line, each of the five memory cells forming part of a different bit line. FIG. 1B shows four memory cells of a same bit line, each of the four memory cells forming part of a different word line.

Each memory cell 12 is associated with an electrically-conductive via 14. Conductive vias 14 cross an electrically-insulating layer 16. Preferably, the upper end of each via 14 is flush with the upper surface of insulating layer 16. Preferably, the lower end of each via 14 is flush with the lower surface of insulating layer 16. The lateral walls of conductive vias 14 are preferably entirely in contact with layer 16 made of electrically-insulating material.

Insulating layer 16 is for example located on a substrate, not shown. Electronic components may be formed inside and on top of the substrate, not shown. In particular, selection elements, for example transistors, may be formed inside and on top of the substrate, not shown. In the example of FIGS. 1A and 1B, device 10 comprises transistors 15 only shown by their gate. Each transistor 15 is for example associated with a memory cell 12 and is used as a selection element for memory cell 12. Each conductive via 14 is, in the example of FIGS. 1A and 1B, in contact with a source or drain region of one of transistors 15.

The device comprises, in the example of FIGS. 1A and 1B, an electrically-conductive wall 19 in electrically-insulating layer 16. Wall 19 preferably extends along the same height as vias 14. In other words, wall 19 preferably extends from the upper surface of layer 16 to the lower layer of layer 16. Wall 19 further extends in the word line direction. Thus, wall 19 is parallel to the word lines. Wall 19 enables to couple drain or source areas of the transistors of a plurality of words lines. Thus, the transistors 15 of certain words lines have a common conduction region (source or drain). Wall 19 is not located under a memory cell 12.

Each cell 12 corresponds to a stack 21 resting on layer 16 and on the via 14 corresponding to memory cell 12. Each stack 21 comprises, in the following order from the upper surface of via 14, an electrically-insulating layer 17 crossed by a resistive element 18, a layer 20 made of a phase-change material, and an electrically-conductive layer 22. Thus, the lower surface of layer 17 rests on the upper surface of layer 16 and of via 14. The upper surface of layer 17 rests on, preferably is in contact with, the lower surface of layer 20. The upper surface of layer 20 rests on, preferably is in contact with, the lower surface of layer 22.

Each layer 17 is crossed, at the level of the stack, by a resistive element 18 or heating element 18. Each heating element 18 for example has an L shape in the plane of FIG. 1A, comprising a horizontal portion and a vertical portion. Each resistive element 18 is made of a material emitting heat when element 18 conducts a current, for example, of a metal. Each resistive element 18 is located on the electrically-conductive via 14 associated with cell 12. Preferably, the lower portion of each resistive element 18, here, the horizontal portion, is in contact with the upper end of the corresponding conductive via 14. The upper end of each resistive element 18, that is, the end of the vertical portion, is flush with the upper surface of insulating layer 17 and is in contact with layer 20 of phase-change material. As an example, the resistive elements may be made of tungsten, of titanium nitride, or of a thermally refractory metal, selected for its resistance to heat and to wearing, or also an adequate alloy.

Each layer 20 of phase-change material is capable of storing data in a memory cell 12. Layers 20 are for example made of an alloy of germanium, of antimony, and of tellurium (GST), for example, of Ge2Sb2Te5. The layers may for example be made of another chalcogen material. One advantage of using a GST material is that the deposition process is compatible to fill cavities and protect the flanks whatever the distance is between the cells (see FIG. 1B).

Each conductive layer 22, or electrode 22, is located on layer 20, preferably in contact with layer 20. Layers 22 are for example made of metal, for example, titanium nitride. A plurality of metal layers, preferably thermally refractory, may be provided.

Preferably, the lateral walls of the different elements of each stack 21 are coplanar. The different layers of stack 21 thus preferably have the same horizontal dimensions, that is, dimensions other than the height. In the example of FIGS. 1A and 1B, the different layers of each stack 21 are not in contact with the corresponding layers in the neighboring cells 12. The different cells 12 are separated from one another by cavities 26.

Cavities 26 may be of two types. Cavities 26a are located between neighboring cells 12, that is, preferably only separated by a selection element. Cavities 26b are located between cells 12 separated by wall 19 or by other elements, creating a distance between memory cells 12. Cavities 26a and 26b differ from one another by the dimensions of the cavities.

In the shown embodiment, the cavities separate the cells in the two horizontal directions (in the plane of the stacks). This amounts to laterally surrounding the different cells with cavities.

As a variant, certain layers may be common to the cells 12 of a same line, for example, to the cells 12 of a same word line. For example, the memory cells 12 of each word line may share a same layer 20 of phase-change material and a same conductive layer 22. The cells 12 of the same word lines are thus not, in this variant, separated by cavities 26.

To program each memory cell 12, it is possible to conduct a current between via 14 and conductive layer 22 and through resistive element 18 and layer 20. The current causes an increase in the temperature of resistive element 18, particularly at the level of its upper end, in contact with phase-change material layer 20. For a sufficient current value, the temperature reaches a value sufficient to change the phase, crystalline or amorphous, of at least a portion of layer 20.

The lateral walls of memory cells 12 are covered with an electrically-insulating layer and with a thermally-insulating layer. An electrically-insulating layer is located between each lateral wall of a stack 21 and the thermally-insulating layer. The electrically-insulating layer here is a layer 24 and the thermally-insulating layer corresponds to thermally-insulating portions 28a, 28b, 28c and to air bubbles 29. Thus, each memory cell 12 is separated from the neighboring cell by an electrically-insulating layer and a thermally-insulating layer.

The previously-described structure is conformally covered with layer 24 made of an electrically-insulating material, for example, of silicon oxide. More particularly, layer 24 covers the lateral walls and the upper surface of memory cells 12 and the exposed portions of the upper surface of layer 16, that is, the portions which are not covered with cells 12. In other words, layer 24 covers the lateral walls of insulating layers 17, layers 18 of phase-change material, layers 20, and conductive layers 22, the upper surfaces of conductive layers 22, and the exposed portions of the upper surface of layer 16. Layer 24 thus covers the bottom and the walls of the cavities 26 separating the different cells 12.

The portions of layer 24 located opposite the lateral walls of layers 20 and 17 of memory cells 12 are thus covered with thermally-insulating portions 28 and/or with air bubbles 29.

Portions 28a fill some of cavities 16a. More particularly, each portion 28a fills the portion of one of these cavities 26a which is not filled with layer 24. Thus, in the cavities 26a comprising portions 28a, the walls and the bottom of the cavity are conformally covered with layer 24 and portions 28a extending at the center of the cavity. More particularly, each portion 28a extends between the portions of layer 24 extending along the walls of the cavity, and all the way to the portion of layer 24 located on the bottom of cavity 26a. Each portion 28a extends at least along a portion of layer 17, preferably along at least 50% of the height of layer 17. Each portion 28a extends along at least a portion of layer 20. Each portion 28a extends at least along half the height of portion 20, preferably along the entire height of layer 20. Each portion 28a extends preferably along the walls of layers 22.

Portions 28c block the opening of the other cavities 26a, forming air bubbles 29 in cavities 26a. Cavity 26a may comprise one or a plurality of portions of the material of portions 28c around air bubble 29, for example, at the bottom of the cavity, between layer 24 and air bubble 29.

Thus, in cavities 26a, under the level corresponding to the upper surface of layer 20, the cavities only comprise electrically-insulating layer 24, portion 28a or 28c, and possibly an air bubble 29. Air bubbles 29 are preferably entirely surrounded with layer 24 and with portion 28. The openings of cavities 26 are totally closed by portions 28c or portions 28a.

Portions 28b are formed on the walls of cavities 26b and on the walls of the peripheral cells 12 of the memory array. Portions 28b form spacers. Portions 28b preferably extend from the upper surface of layer 24 located on the bottom of cavity 26b. Portion 28b extends at least down to the level of the upper surface of layer 17, preferably at least down to the level of the upper surface of layer 20. Portions 28b extend at least along the area of contact between resistive element 18 and layer 20. Portions 28b thus preferably extend up to at least 75% of the height of resistive elements 18. Portions 28b thus preferably extend up to at least 50% of the height of layer 20, preferably up to the entire height of layer 20.

The material of portions 28 is a thermally-insulating material, that is, having a low thermal conductivity. The material of portions 28 is thus a lightly thermally-conductive material. Preferably, the material of portions 28 has a thermal conductivity smaller than 1.5 $W \cdot m^{-1} \cdot K^{-1}$ for temperatures in the range from approximately 230° K (−40° C.) to 600° K (326.85° C.), preferably smaller than 1 $W \cdot m^{-1} \cdot K^{-1}$ for temperatures in the range from approximately 230° K (−40° C.) to 600° K (326.85° C.), preferably smaller than 0.5 $W \cdot m^{-1} \cdot K^{-1}$ for temperatures in the range from approximately 230° K (−40° C.) to 450° K (176.85° C.). The thermal conductivity of the material of layer 30 is smaller than the thermal conductivity of the material of layer 24, for example, silicon oxide or silicon nitride, for temperatures in the range from approximately 230° K to 600° K.

Preferably, the material of portions 28a, 28b, 28c is a chalcogen. Preferably, the material of portions 28a, 28b, 28c is the same material as the material of layers 20 of phase-change material. The enables to re-use the same manufacturing tools and machines. Preferably, portions 28a, 28b, 28c are made of an alloy of germanium, of antimony, and of tellurium. Chalcogen materials with binary compositions (Ge Te, Sb Te, etc.) may also be provided.

Preferably, portions 28a, 28b, 28c and air bubbles 29 are in contact with the portions of layer 24 covering the walls of memory cells 12.

The thermal conductivity of air is low, substantially equal to zero. The thermal conductivity of air is thus lower than the thermal conductivity of the material of layer 20 and of portions 28. Air bubbles 29 thus take part in the thermal insulation of memory cells 12.

The lateral walls of memory cells 12 are thus thermally insulated by portions 28a, 28b, 28c and by air bubbles 29. The thermal insulation of the different cells 12 enables to decrease the temperature loss by the walls of memory cells 12, and thus the power loss used so that resistive element 18 reaches the temperature at which the phase-change material of layer 20 changes phase.

Further, the thermal insulation enables to avoid for the heating of the resistive element 18 of a cell 12, for example, during the programming of cell 12, to have an influence on the neighboring cells 12.

In an embodiment, electrically-insulating layer 24 and the thermally-insulating material (portions 28 and air 29) cover all the lateral walls of each cell.

Figure 2:
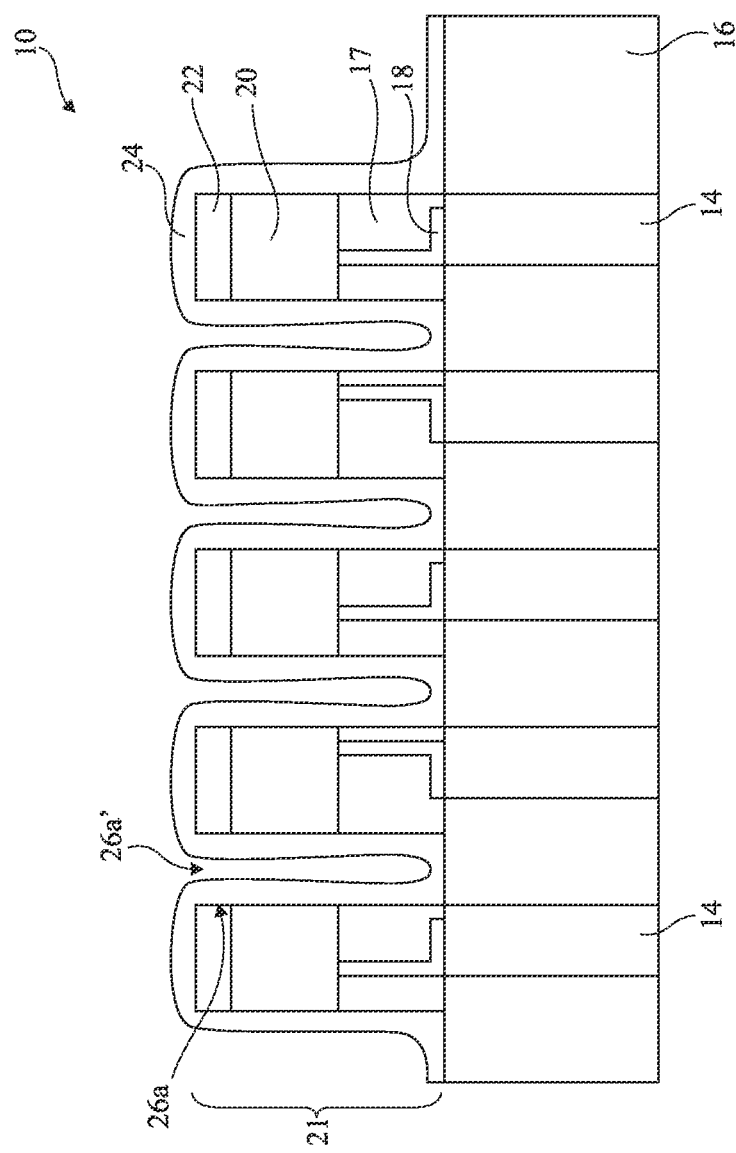
FIG. 2 shows the result of a manufacturing step of the device of FIGS. 1A and B.
Figure 3:
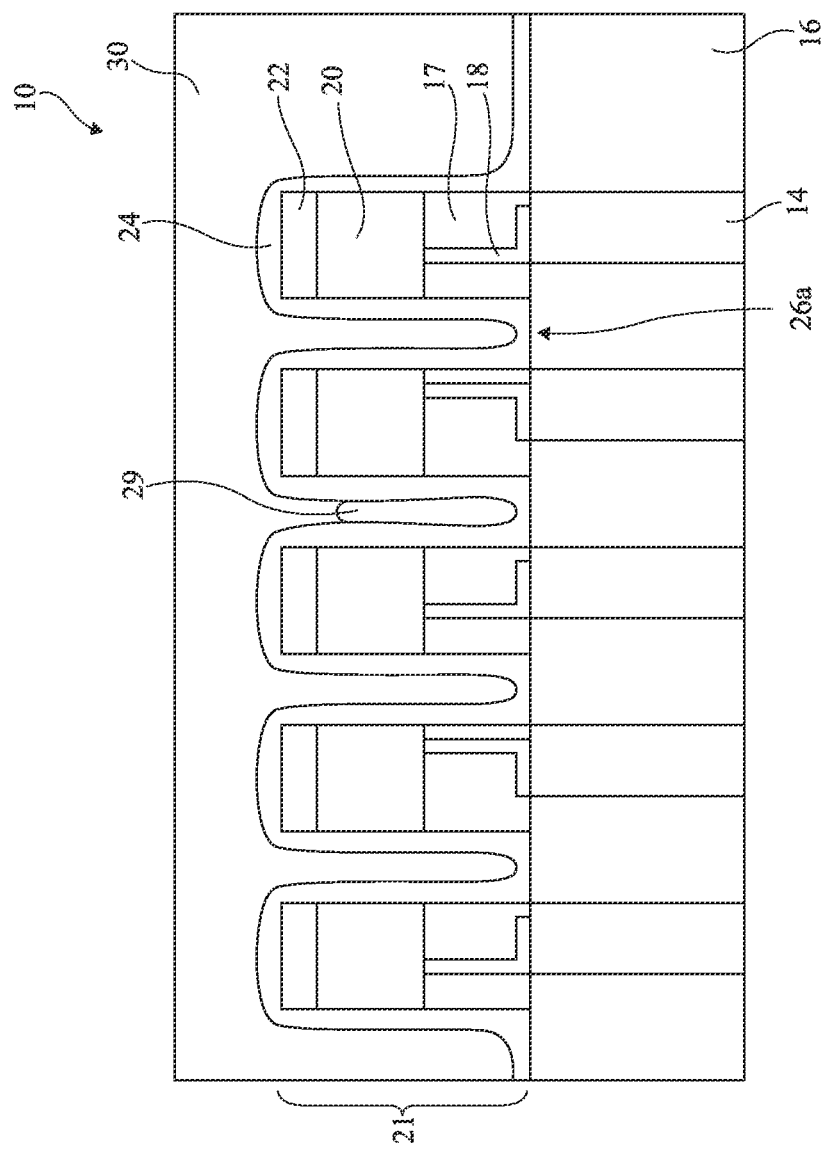
FIG. 3 shows the result of another manufacturing step of the device of FIGS. 1A and B.

FIGS. 2 and 3 show the result of successive steps of manufacturing of the device of FIGS. 1A and 1B. FIGS. 2 and 3 show cross-section views in the plane of FIG. 1A.

FIG. 2 shows the result of a step of manufacturing of the device of FIGS. 1A and B. The step resulting in the structure of FIG. 2 comprises a plurality of steps, preferably successive, described hereafter.

The step having its result shown in FIG. 2 comprises the forming, inside and on top of the substrate, not shown, of selection elements 15, not shown in FIG. 2. The step further comprises the forming of layer 16. Layer 16 is preferably formed over the entire structure, that is, over the entire upper surface of the substrate, not shown, and over transistors 15. The source and drain regions and the gate of each transistor 15.

The step comprises the forming of vias 14 and of walls 19. This for example comprises the forming of cavities crossing layer 16 at the locations of vias 14 and of walls 19 and the filling of the cavities with a conductive material, for example, a metal.

The step comprises the forming of layers 17 of electrically-insulating material and the forming of resistive elements 18. This for example comprises the forming of an insulating layer having a thickness substantially equal to the thickness of layer 17. Such a layer is then for example etched to form cavities, each via 14 being located opposite the wall of a cavity. A layer made of the material of resistive elements 18 and having a thickness substantially equal to the thickness of the vertical and horizontal portions of each resistive element 18 is conformally formed on the structure and in particular on the cavity walls. An anisotropic etching is for example then performed to remove the portions of the layer made of the material of resistive elements 18, to form resistive elements 18. The cavities are then filled with an electrically-insulating material.

The step then comprises the forming of layers 20 made of the phase-change material and of electrically-conductive layer 22. This for example comprises the forming of a layer made of the phase-change material, for example having a thickness substantially equal to the thickness of layer 20, over the entire structure, and the forming of a layer made of the material of layer 22 on the upper surface of the layer made of the phase-change material. Layers 20, 22, and 17 are then etched to individualize memory cells 12. Cavities 26a and 26b are thus formed between the different cells 12.

The step also comprises the forming of layer 24. Layer 24 is conformally deposited on the structure. In particular, layer 24 entirely covers stacks 21. Layer 24 thus covers the walls and the bottom of cavities 26a and 26b.

The thickness of layer 24 is selected to be sufficiently low to avoid filling cavities 26a. Thus, cavities 26a always comprise a cavity 26a' extending from the opening of cavities 26a. Cavities 26a' preferably extend at least along half the height of stacks 21, preferably along at least 75% of the height of stacks 21. Each cavity 26a' preferably extends at least all the way to the level of the points of contact between resistive elements 18 and layers 20. Preferably, each cavity extends at least along a portion of resistive elements 18.

FIG. 3 shows the result of another step of manufacturing of the device of FIGS. 1A and 1B.

During this step, a layer 30 of a thermally-insulating material is formed on the structure of FIG. 2. The thickness of layer 30 is sufficient to entirely cover memory cells 12. In particular, the portions of layer 24 located on the upper surface of layers 22 are covered with layer 30.

Layer totally fills cavities 26b, cavities 26b being sufficiently wide to allow the forming of layer 30. Cavities 26a' are however narrower. The dimensions of layer 24, and of layers 17, 20, and 22 of stacks 21 may vary and thus vary the dimensions of cavities 26a'. More particularly, the dimensions of the openings of cavities 26a' may be different from one line to the other. Thus, certain cavities 26a' are totally filled with layer 30 and certain cavities 26a', having an opening, for example, of smaller dimensions, are only closed by layer 30, the cavity then comprising an air bubble 29. All cavities 26 are thus closed.

Layer 30 is made of the material of portions 28. Preferably, layer 30 is thus made of a chalcogen material. Preferably, layer 30 is such as deposited in an amorphous phase. Indeed, the thermal conductivity of chalcogen materials, and particularly of GST, is lower in their amorphous state. Layer 30, and thus portions 28, are for example made of a chalcogen material having a temperature of transition from the amorphous state to the crystalline state higher than the temperature of transition from the amorphous state to the crystalline state of the material of layers 20. One advantage of using a GST material is that the deposition process is compatible to fill cavities and protect the flanks whatever the distance is between the cells (see FIG. 1B).

The manufacturing method of the embodiment of FIGS. 1A and 1B comprises steps subsequent to the steps having their result shown in FIG. 3. In particular, these steps comprise the partial etching of layer 30. Thus, a step of anisotropic etching of layer 30 is carried out. Such an etch step enables to form portions 28.

The anisotropic etching particularly removes the portions of layer 30 facing walls 19 and the portions of layer 30 located opposite the upper surface of layer 22, to be able to form vias reaching layer 22 and wall 19 without for the vias to be in contact with portions 28. The etching is however not maintained for a sufficiently long time to reach air bubbles 29 and the portions of material of layer 30 located under the level of the upper surface of layers 20.

Preferably, the structure is then covered with an electrically-insulating layer, not shown in FIGS. 1A to 3.

Various embodiments and variants have been described. Those skilled in the art will understand that certain features of these various embodiments and variants may be combined, and other variants will occur to those skilled in the art.

Finally, the practical implementation of the described embodiments and variations is within the abilities of those skilled in the art based on the functional indications given hereabove.

Such alterations, modifications, and improvements are intended to be part of this disclosure, and are intended to be within the spirit and the scope of the present disclosure. Accordingly, the foregoing description is by way of example only and is not intended to be limiting. The present disclosure is limited only as defined in the following claims and the equivalents thereto.

A memory device may be summarized as including phase-change memory cells (12), lateral walls of each cell being covered with a first electrically-insulating layer (24) and with at least one first (28, 29) thermally-insulating material.

A method of manufacturing a memory device may be summarized as including the forming of memory cells (12) and the forming of a first electrically-insulating layer (24) and of at least one first (28, 29) thermally-insulating material covering each lateral wall of the memory cells.

Each memory cell (12) may include a stack (21) of a resistive material (18), of a second layer (20) of a phase-change material, and of an electrode (22) resting on the first layer.

The electrically-insulating layer (24) may totally cover the lateral walls of the resistive element (18) and of the first layer (20).

First cavities (26a) between memory cells (12) may be filled with the first thermally-insulating material (28c) and with air.

Second cavities (26a) between memory cells (12) may be filled with the first thermally-insulating material (28).

Third cavities (26b) may include spacers (28b) made of the thermally-insulating material on at least one wall, said at least one wall being formed by a lateral wall of a memory cell (12) covered with the electrically-insulating layer (24).

The first (28, 29) thermally-insulating material may be in contact with the first layer (24).

The first thermally-insulating material (28) may be a phase-change material.

The first thermally-insulating material (28) may be the material of the first layer (20).

The first electrically-insulating layer (14) may be made of silicon oxide or of silicon nitride.

The first material (28) may include portions made of an alloy of germanium, of antimony, and of tellurium, or of a chalcogen material made of germanium and of tellurium or of antimony and of tellurium, and air bubbles.

The electrically-insulating layer and the thermally-insulating material may cover all the lateral walls of each cell.

The method may include the conformal deposition of the first layer (24) on the memory cells (12).

The method may include the deposition of a third layer (30) made of the first material, entirely covering the memory cells (12) and the first layer (24).

The method may include a step of partial anisotropic etching of the third layer (30).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A memory device, comprising:
an insulating layer;
a plurality of phase-change memory cells above the insulating layer, each phase change memory cell including:
a resistive element;
a first layer of phase change material on the resistive element; and
an electrode on the first layer of phase-change material;
an electrically-insulating layer covering lateral walls of the first layer of phase-change material and the electrode of each of the phase-change memory cells and the insulating layer between adjacent memory cells; and
a second layer of phase-change material covering the lateral walls of the electrically-insulating material between the phase-change memory cells.

2. The device according to claim 1, wherein the electrically-insulating layer totally covers the lateral walls of the resistive material and of the layer of phase-change material.

3. The device according to claim 1, wherein the second layer of phase-change material and the first layer of phase-change material are formed of a same material.

4. The device according to claim 1, wherein a first cavity between a first adjacent pair of the phase-change memory cells is filled with the second layer of phase-change material and with air.

5. The device according claim 4, wherein a second cavity between a second adjacent pair of the phase-change memory cells is filled with the second layer of phase-change material.

6. The device according to claim 5, further comprising a spacer made of the second layer of phase-change material on a lateral wall of at least one phase-change memory cell of the first or second adjacent pairs, the electrically-insulating layer disposed between the lateral wall and the spacer.

7. The device according to claim 1, wherein the electrically-insulating layer is made of silicon oxide or of silicon nitride.

8. The device according to claim 1, wherein the second layer of phase-change material includes portions made of an alloy of germanium, of antimony, and of tellurium, or of a chalcogen material made of germanium and of tellurium or of antimony and of tellurium, and air bubbles.

9. The device according to claim 1, wherein the electrically-insulating layer and the second layer of phase-change material cover all the lateral walls of each of the phase-change memory cells.

10. A device, comprising:
a first and a second memory cell, each of the first and second memory cells including:
a resistive element having an L-shape; a first electrically-insulating layer surrounding the resistive element;
a phase-change layer on the resistive element and on the first electrically-insulating layer; and
an electrically-conductive layer on the phase-change layer;
a second electrically-insulating layer covering upper surfaces and lateral side surfaces of each of the first and second memory cells;
a thermally-insulating layer on the second electrically-insulating layer, the thermally-insulating layer extending at least partially into a space between the first and second memory cells;
and a second layer of phase-change material covering the lateral walls of the second electrically-insulating layer between the first and second memory cells.

11. The device of claim 10, further comprising:
a thermally-insulating spacer on an outer lateral side surface of each of the first and second memory cells, the outer lateral side surfaces facing away from the space between the first and second memory cells.

12. A device, comprising:
a first phase change-memory cell on a substrate;
a second phase-change memory cell on the substrate, first phase-change memory cell and the second phase-change memory cell each including:
a resistive element;
a first layer of phase-change material on the resistive element; and
an electrode on the first layer of phase-change material;
a first electrically insulating layer covering a top surface of the electrode at the first phase-change memory cell and the second phase-change memory cell, lining a sidewall of the electrode at the first phase-change memory cell and the second phase-change memory cell, lining a sidewall of the first layer of phase-change material at the first phase-change memory cell and the second phase-change memory cell, and positioned on a top surface of the substrate between the first phase-change memory cell and the second phase-change memory cell; and
a second layer of phase-change material covering sidewalls of the electrically-insulating layer and positioned between the first and second phase-change memory cells.

13. The device of claim 12, comprising an air gap between the first and second phase change-memory cells and abutting the second layer of phase change material.

14. The device of claim 12, wherein the first and second phase-change memory cells each include a second electrically insulating layer surrounding the resistive element and in contact with the first electrically insulating layer.

15. The device of claim 12, wherein the first electrically insulating layer is in contact with the resistive element.

16. The device according to claim 12, wherein the electrically-insulating layer is made of silicon oxide or of silicon nitride.

17. The device according to claim 12, wherein the second layer of phase-change material includes portions made of an alloy of germanium, of antimony, and of tellurium, or of a chalcogen material made of germanium and of tellurium or of antimony and of tellurium, and air bubbles.

\* \* \* \* \*